United States Patent [19]
Lakshmikumar

[11] Patent Number: 5,945,881
[45] Date of Patent: Aug. 31, 1999

[54] PLL FREQUENCY SYNTHESIZER WITH K MULTIPLICATION IN ADDITION TO DIVISION FOR SUBTRACTION OF PHASE NOISE

[75] Inventor: Kadaba R. Lakshmikumar, Somerset, N.J.

[73] Assignee: Lucent Technologies Inc., Murray Hill, N.J.

[21] Appl. No.: 09/005,877

[22] Filed: Jan. 12, 1998

[51] Int. Cl.[6] .............................. H03L 7/08; H03L 7/099; H03L 7/18; H03B 19/00
[52] U.S. Cl. .............................. 331/16; 331/1 A; 331/18; 331/57; 331/25; 327/116; 327/119; 327/107; 327/159
[58] Field of Search .............................. 331/1 A, 2, 16, 331/18, 25, 57; 327/116, 119–123, 105–107, 156–159

[56] References Cited

U.S. PATENT DOCUMENTS

| | | |
|---|---|---|
| 4,516,083 | 5/1985 | Turney .............................. 331/1 A |
| 5,180,994 | 1/1993 | Martin et al. .............................. 331/38 |
| 5,428,318 | 6/1995 | Razavi .............................. 331/57 |
| 5,436,939 | 7/1995 | Co et al. .............................. 375/376 |
| 5,530,387 | 6/1996 | Kim .............................. 327/119 |
| 5,548,251 | 8/1996 | Chou et al. .............................. 331/57 |
| 5,565,817 | 10/1996 | Lakshmikumar .............................. 331/57 |
| 5,786,715 | 7/1998 | Halepete .............................. 327/116 |

*Primary Examiner*—David Mis

[57] ABSTRACT

A frequency synthesizer is supplied with an input signal of frequency $f_i$ to provide an output signal $f_o$ where $f_o = f_i M/N$ and M and N are integers. The input signal is first applied to a divider circuit for division by $M/K$ where K is an integer and the resultant is applied as inputs to a phase locked loop. The phase locked loop includes a ring oscillator of frequency $f_i N/M$, a frequency multiplier circuit for multiplying by K, and a frequency divider circuit for dividing by N. The ring oscillator uses a combinational logic circuit that combines the outputs of four differential delay elements to produce a frequency multiplication of four.

7 Claims, 3 Drawing Sheets

PLL FREQUENCY SYNTHESIZER WITH K MULTIPLICATION IN ADDITION TO DIVISION FOR SUBTRACTION OF PHASE NOISE

FIELD OF THE INVENTION

This invention relates to frequency synthesizers and more particularly to frequency synthesizers that use a phase-locked loop to generate the output frequency.

BACKGROUND OF THE INVENTION

A frequency synthesizer is a circuit that generates one or more output signals whose frequency bears a prescribed relation to the frequency of an input reference signal. Such circuits are used as accurate frequency sources in a wide variety of electronic apparatus.

Generally a frequency synthesizer provides an output frequency $$f_o = \frac{N}{M} f_i \qquad \text{equation (1)}$$

where $f_i$ is the input or reference frequency and where the values of N and M are integers chosen to provide the desired ratio between the input and output frequencies.

A common form of frequency synthesizer uses a phase-locked loop (PLL) to set the output frequency. In FIG. 1 there is shown the basic circuit 10 of a common form of prior art PLL frequency synthesizer. A signal of frequency $f_i$ is supplied as an input to a divider circuit 12. The output of the divider circuit is supplied as an input to the PLL 14, an element of which is a divider circuit. For purposes of illustration, the divider circuit has been shown as a separate element 16 in the feedback loop of the PLL, although more precisely it can be viewed to be a part of the PLL. An expanded view of a PLL is shown in FIG. 3. As shown in FIG. 1, the divider 12 divides by the integer M and the divider 16 by the integer N. The signal of output frequency $f_o$ from the PLL has a frequency of $f_i N/M$.

The principles of PLL frequency synthesizers are set forth in a book entitled *Phase-Locked Loop Circuit Design* by D. H. Wolaver, Prentice-Hall, Englewood Cliffs, N.J., (1991) with particular reference to Chapter 11, pages 239–260, "Frequency Synthesizers" and the teachings of the book are incorporated herein by reference.

A PLL generally comprises a closed loop that includes a phase detector (PD) and a voltage controlled oscillator (VCO), along with a frequency divider that divides by N. When in lock, the frequency $f_i/M$ and the frequency $f_o/N$ that serve as frequencies of the two inputs to the phase detector are equal, so that the output frequency $f_o$ is equal to $f_i N/M$. A common form of VCO for use in a PLL is a ring oscillator that employs a series of delay elements to provide the desired frequency range of operation.

The bandwidth of the closed loop is known to be an important factor in controlling the jitter in the output frequency of a PLL frequency synthesizer. In particular, a wide loop bandwidth can offer a higher suppression of the VCO phase noise than a narrow loop bandwidth. Quantitatively the output jitter is inversely proportional to the square root of the loop bandwidth. However loop stability considerations limit the closed loop bandwidth that can be safely used. The limit is about a tenth of the rate at which the PD in the PLL is updating. Thus large M and/or N values in the PLL shown in FIG. 1 restrict the feasible bandwidth of the loop.

The present invention seeks to avoid this problem and makes it feasible to employ relatively large values of M and/or N defining the relation between the input and output frequencies without violating loop stability considerations.

SUMMARY OF THE INVENTION

In accordance with the invention, a PLL frequency synthesizer that is designed to provide an output frequency $f_o = N/M f_i$ uses a first frequency divider to divide the input signal to the PLL by a factor of M/K (where M/K is an integer) and then includes in the loop of the PLL both a circuit for dividing by N and a circuit for multiplying by the factor K. The factors K and M/K are each appropriately chosen integers, as will be discussed below. In this instance because the input frequency to the PLL has been increased by the factor K, the bandwidth feasible for the loop is multiplied by the factor K. The larger bandwidth for the loop provides higher suppression of the VCO phase noise and better jitter control of the output frequency of the frequency synthesizer.

Moreover, in a preferred product embodiment of the invention, in the ring oscillator structure of the VCO, as a separate feature of the invention, a logic circuit combines the outputs of the delay elements in the ring to realize a clock output of the VCO that is K times the basic VCO frequency. In particular in an illustrative embodiment, K is chosen to be four, and four delay elements are used in the ring of the VCO to produce eight equally spaced phases that are combined in a novel combinational logic circuit to realize a clock that is four times the basic VCO frequency.

In accordance with a process embodiment, the invention is a method in which an output signal of frequency $f_i N/M$ is synthesized from an input signal of frequency $f_i$ and where M and N are integers. The method is as follows: An input signal of frequency $f_i$ has its frequency divided to provide a resulting frequency of $f_i K/M$ where K and K/M are integers; the resultant is applied as one input to the phase detector of a phase locked loop and the output of the phase detector is used to control an oscillator in the phase locked loop; a portion of the oscillator output that has a frequency $f_i N/M$, has its frequency multiplied by K and divided by N to provide a signal that is used as the second input to the phase detector of the phase locked loop.

The invention will be better understood when taken with the following more detailed description.

DETAILED DESCRIPTION

Figure 1:
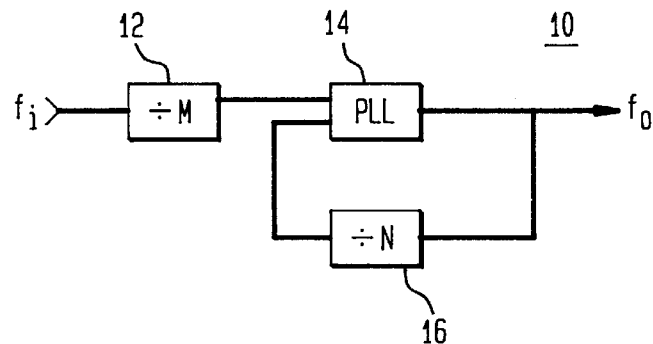
FIG. 1 is a block diagram of the basic PLL frequency synthesizer of the prior art that has been discussed.
Figure 2:
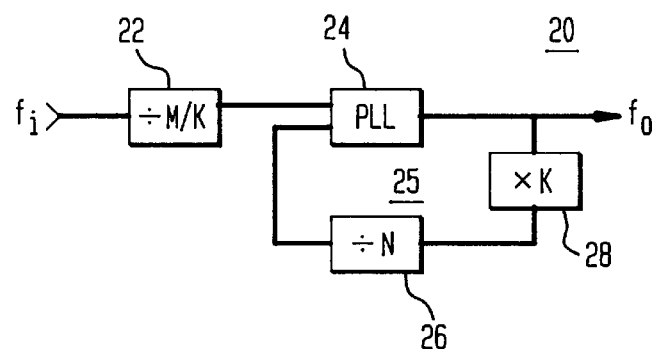
FIG. 2 is a block diagram of a PLL frequency synthesizer in accordance with the invention.

With reference now to FIG. 2, the PLL frequency synthesizer 20 is an illustrative embodiment of the invention that is designed specifically to convert an input signal of frequency $f_i$ of 51.84 MHz to an output signal of frequency $f_o$ of 29.16 MHz, a reduction by a factor of 9/16 (N=9, M=16). To this end, the synthesizer 20 includes a circuit 22 that divides the input frequency by a factor M/K. This signal is supplied as one signal to the PLL 24. The value of K in the example is four. The PLL includes in its closed loop 25 a circuit 28 that multiplies the frequency of the VCO by the factor K, and a circuit 26 that divides the frequency of its input signal by N, nine in this example. Accordingly, the closed loop essentially provides a division by 9/4. The net effect of the circuit 20 is to provide a factor of 9/16 for N/M in equation (1).

Figure 3:
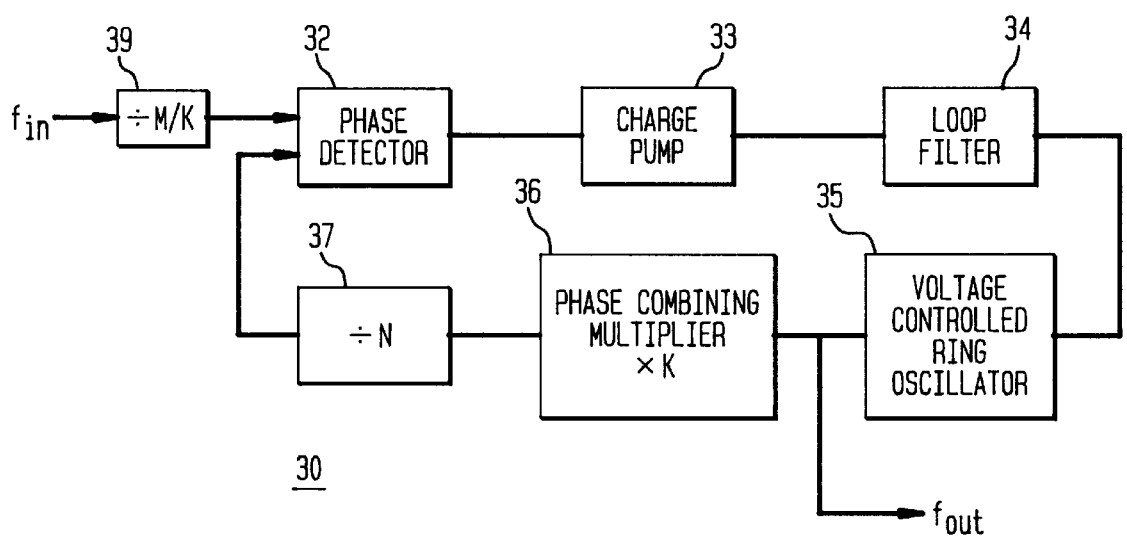
FIG. 3 is a block circuit schematic of the frequency synthesizer of FIG. 2.

FIG. 3 is a more detailed circuit block schematic of a preferred embodiment 30 of the invention. In some respects, circuit 30 resembles the frequency synthesizer described in my prior U.S. Pat. No. 5,565,817 that issued on Oct. 15, 1996. It includes a phase detector 32 (PD) whose output supplies a charge pump 33 that supplies a loop filter 34. The loop filter output is applied as an input to a voltage controlled ring oscillator 35 (VCO). The output of the VCO is the useful output of frequency $f_o$. A portion of this output is supplied to a novel circuit 36, described as "a phase combining multiplier," to be discussed in more detail with respect to FIGS. 4 and 5. Circuit 36 multiplies the frequency $f_o$ by a factor K, for example 4, in the specific illustrative embodiment.

The output of circuit 36 is applied as an input to the frequency divider circuit 37, which divides the multiplied frequency $Kf_o$ by N to provide a signal of frequency $f_o K/N$ that is applied as one input of the phase detector 32. The other input of the phase detector that needs to lock with the first input is a signal of frequency $f_i M/K$ obtained by dividing the input reference signal of frequency $f_i$ by M/K in divider circuit 39. The values of M and N are chosen to provide the desired relationship $f_o = M/N f_i$. In the illustrative embodiments $f_i$ is 51.84 MHz and $f_o$ 29.16 MHz and the smallest set of M and N integral values to achieve the desired frequency change is M equal to 16 and N equal to 9.

The basic operation of a frequency synthesizer of the general type represented by FIG. 3 is described in detail in my prior aforementioned patent whose disclosure is incorporated herein by reference.

Figure 4:
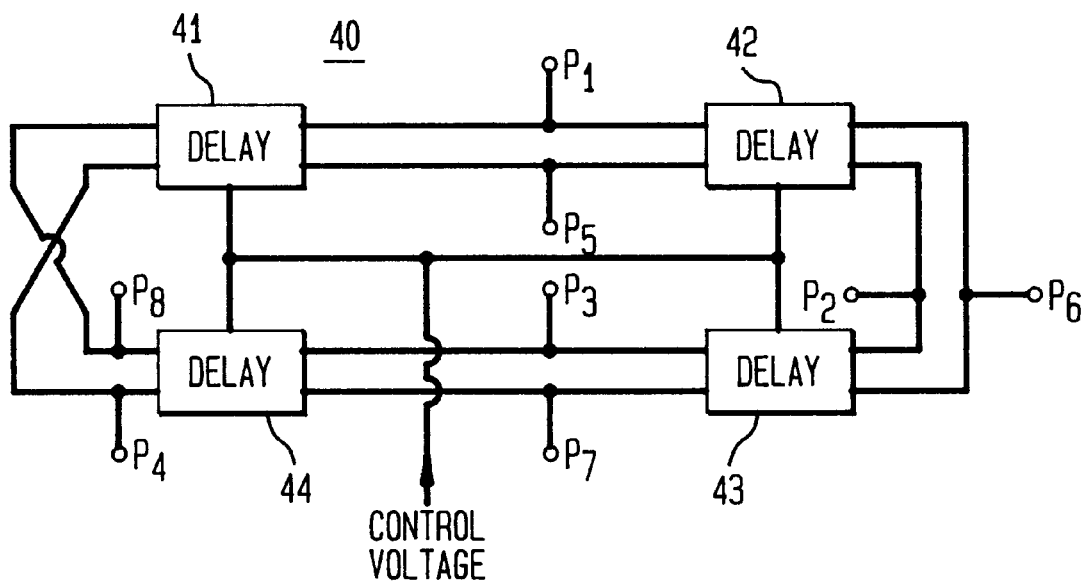
FIG. 4 is a block circuit schematic of a preferred form of a voltage-controlled; ring oscillator for use in the frequency synthesizer of FIG. 3.
Figure 5:
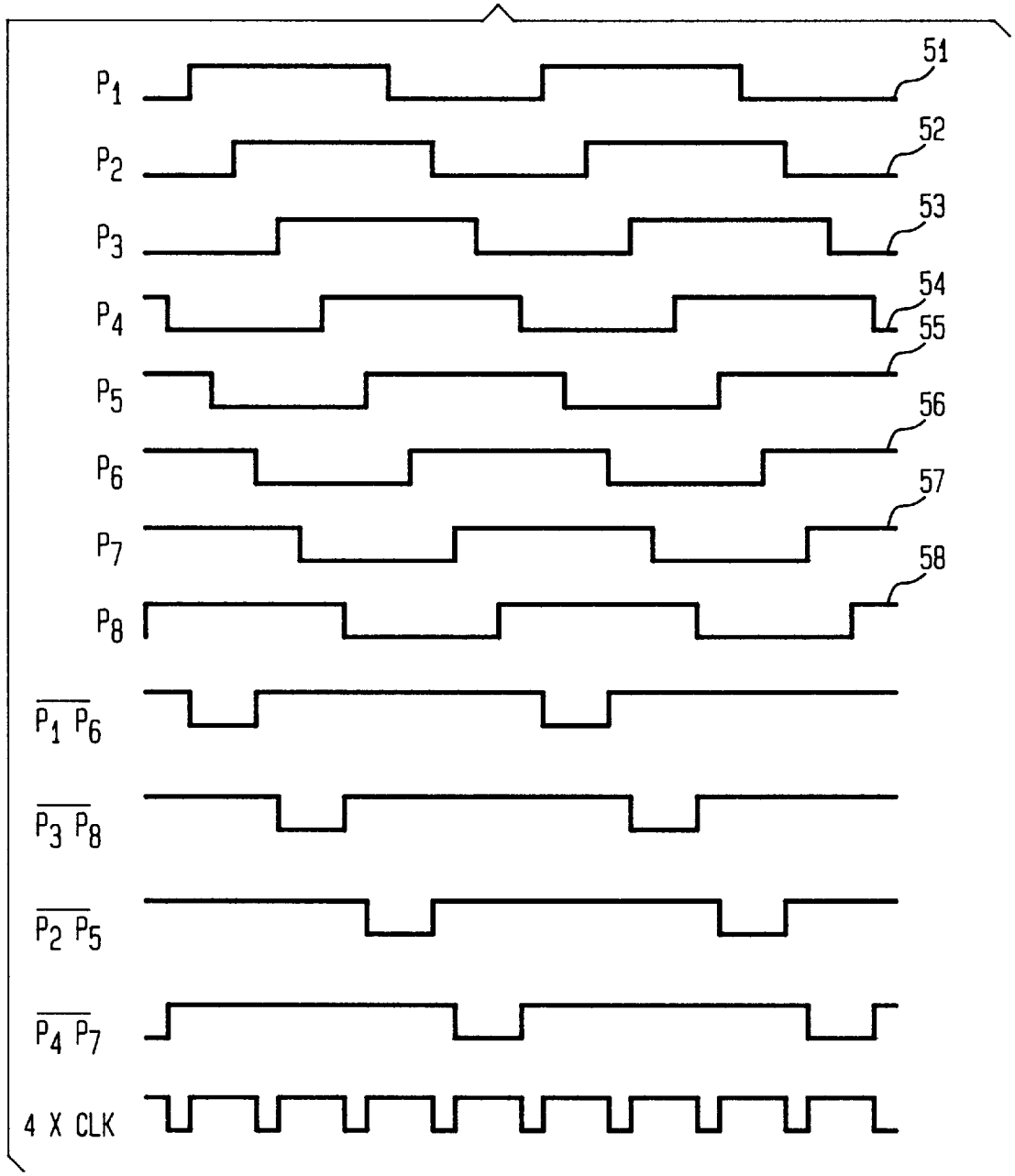
FIG. 5 illustrates the wave forms produced by the ring oscillator shown in FIG. 4.

FIG. 4 shows the basic structure of a voltage controlled ring oscillator suitable for use in the circuit of FIG. 3. It comprises a ring of four uniform stages of differential delay elements 41–44, such as is described in the aforementioned patent. The current through the delay elements, which is controlled by a control voltage, sets the delay of the delay elements. The outputs of the four stages are provided with eight taps $P_1$–$P_8$ as shown. When the loop is in lock, the eight taps of the fully differential four stage ring oscillator produce eight equally spaced phases, as seen in FIG. 5, where there is shown plotted versus time the wave forms 51–58 available at the eight different taps $P_1$–$P_8$.

Figure 6:
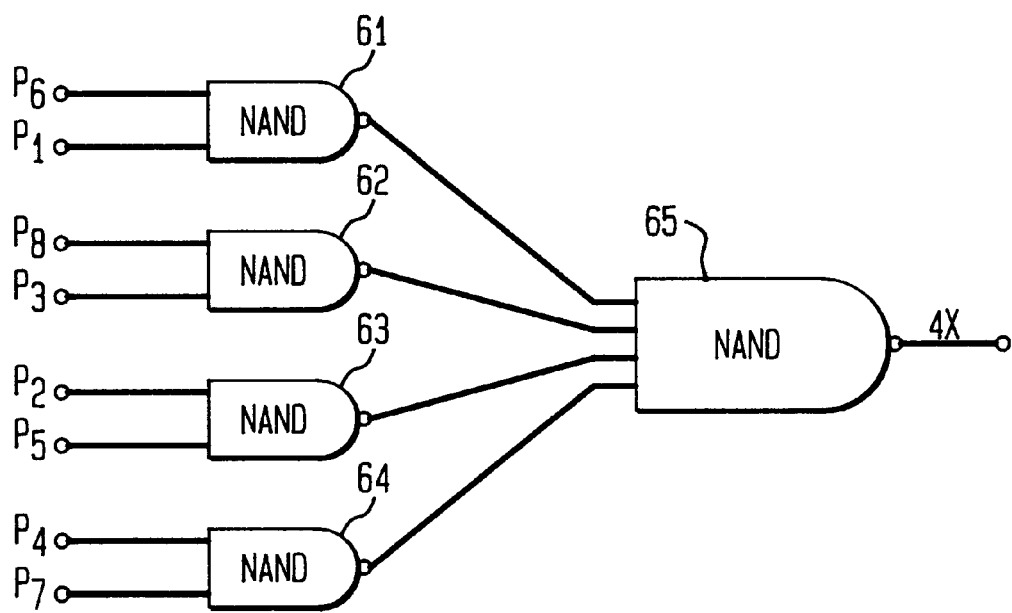
FIG. 6 illustrates the logic circuit for combining the eight wave forms of FIG. 4 to provide a clock that is four times the basic frequency of the VCO in accordance with a feature of the preferred embodiment of the invention.

To provide the desired multiplication by a factor of four, the eight different waveforms are combined in the manner shown in FIG. 6 by the use of four two-input NAND gates 61–64 and the single four-input NAND gate 65. In particular, the waveforms at taps $P_6$ and $P_1$ are combined in NAND 61, $P_8$ and $P_3$ in NAND 62, $P_2$ and $P_5$ in NAND 63, $P_4$ and $P_8$ in NAND 64. The outputs of the four NANDs 61–64 are combined in NAND 65. In FIG. 5, the resultant waveform of the combinational logic operation $P_1P_6+P_3P_8+P_5P_2+P_7P_4$ is shown as waveform 59. It can be appreciated that by appropriate choice of the number of delay elements in the ring oscillator and appropriate combinations of the different waveforms available the multiplication factor can be controlled to a desired value. It should be noted that NAND gate 65 should have essentially the same delay from each of its four inputs to its output.

The arrangement of FIG. 6 when combined with a voltage-controlled ring oscillator of the kind shown in FIG. 4 can provide a signal of frequency $4f_o$ to the divider 37 in the frequency synthesizer of FIG. 3.

Accordingly, it can be appreciated that the invention makes possible a wide range of frequency conversions by appropriate choice of values of M and N and by appropriate choice of the K factor. Relatively large values of M and N can be used while still providing a wide enough bandwidth in the closed loop of the PLL to keep jitter low in the synthesized frequency. Specifically the bandwidth of the loop can be increased by the value of K as compared to the prior art.

Accordingly, it is to be understood that the specific embodiment described is merely illustrative of the general principles of the invention and various other embodiments may be devised without departing from the spirit and scope of the invention.

What is claimed:

1. A frequency synthesizer for converting an input signal of frequency $f_i$ applied to its input terminal to an output signal of frequency $f_o$ at its output terminal where $f_o = N/M f_i$ where N and M are integers comprising a first divider circuit for receiving the input signal of frequency $f_i$ and providing a signal of frequency $f_i K/M$ where K and K/M are integers;

a phase detector having a first and second input terminal and an output terminal, the first input terminal of the phase detector being supplied with a first signal of frequency $f_i K/M$;

a phase-locked loop between said second input terminal of the phase detector and the output of the phase locked loop, the loop including a voltage controlled oscillator for operating at $f_o$, a circuit for multiplying by K and a circuit for dividing by N for providing a signal of $f_o K/N$ to the second input terminal of the phase detector; the output terminal of the voltage-controlled oscillator being the output of the synthesizer.

2. A frequency synthesizer in accordance with claim 1 in which M equals 16, N equals 9, and K equals 4.

3. A frequency synthesizer in accordance with claim 1 in which the voltage controlled oscillator is (the) a ring oscillator that includes four differential delay elements whose eight terminals provide eight signals of different phases and the multiplier circuit for multiplying by K includes four two-input NAND gates, each of which is supplied as inputs with a different pair of the eight signals and whose four outputs are supplied to a four-input NAND gate whose output is supplied to the (second divider) circuit for dividing by N.

4. A frequency synthesizer in accordance with claim 1 in which N is smaller than M whereby the output frequency is a fraction of the input frequency.

5. A process for synthesizing an output signal of frequency $_o$ from an input signal of frequency $f_i$ where $f_o N/M$ where N and M are integers comprising the steps of providing from the input signal a signal of frequency $f_i K/M$ where K and M/K are integers;

applying this signal of frequency $f_i K/M$ as one input to a phase detector of a phase-locked loop that includes a voltage-controlled oscillator;

providing as the second input to the phase detector a signal of frequency $f_o K/N$ obtained by multiplying by K and dividing by N the frequency $f_o$ available at the output terminal of the voltage-controlled oscillator of the phase-locked loop;

using the output of the phase detector to control the frequency of the voltage-controlled oscillator in the phase-locked loop so that its output is a signal of the desired output frequency $$f_i \frac{N}{M}.$$

6. The process of claim 5 in which the voltage-controlled oscillator is a ring oscillator comprising four delay elements in a ring and the delay elements are used to create eight equally spaced pulses that are combined in turn in four two-input NAND circuits whose outputs are combined in a four-input NAND circuit to provide an output that is 4 times the voltage controlled oscillator frequency for use in providing the second input.

7. A circuit for multiplying by four the output frequency of a voltage-controlled oscillator that includes as its feedback path a ring of four uniform stages of differential delay elements comprising:

eight taps, a different one at each of the eight terminals associated with the four stages of delay elements;

four two-input NAND circuits each supplied with the voltages at a different pair of taps from two different delay elements, and providing a separate output;

and a four-input NAND circuit to which are supplied as inputs the separate outputs of said four two-input NAND circuits for providing at its output the multiplied-by-four frequency.

* * * * *